US009947709B2

(12) United States Patent
Huang et al.

(10) Patent No.: US 9,947,709 B2
(45) Date of Patent: Apr. 17, 2018

(54) CMOS IMAGE SENSOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Herb He Huang, Shanghai (CN); Clifford Ian Drowley, Shanghai (CN); Guan Qie Gao, Shanghai (CN); De Jun Bao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 18 days.

(21) Appl. No.: 15/285,269

(22) Filed: Oct. 4, 2016

(65) Prior Publication Data
US 2017/0170224 A1    Jun. 15, 2017

(30) Foreign Application Priority Data
Dec. 10, 2015    (CN) .......................... 2015 1 0916698

(51) Int. Cl.
| H01L 29/00 | (2006.01) |
| H01L 27/146 | (2006.01) |
| H01L 23/522 | (2006.01) |
| H01L 23/64 | (2006.01) |
| H01L 27/06 | (2006.01) |
| H01L 49/02 | (2006.01) |

(52) U.S. Cl.
CPC .... *H01L 27/14636* (2013.01); *H01L 23/5223* (2013.01); *H01L 23/642* (2013.01);
(Continued)

(58) Field of Classification Search
CPC .............. H01L 23/5223; H01L 28/90; H01L 27/146–27/14893; H01L 27/1057; H01L 21/823406
(Continued)

(56) References Cited

U.S. PATENT DOCUMENTS

| 6,541,294 B1 * | 4/2003 | Yamazaki ......... H01L 21/32136 257/E21.311 |
| 7,157,787 B2 | 1/2007 | Kim et al. |

(Continued)

OTHER PUBLICATIONS

Sukegawa et al, ISSCC 2013/Session 27/Image sensors/27.4 A ¼-inch 8Mpixel Back-Illuminated Stacked CMOS Image Sensor, ISSCC 2013 / Feb. 20, 2013 pp. 484-486.
(Continued)

*Primary Examiner* — Kevin M Picardat
(74) *Attorney, Agent, or Firm* — Anova Law Group, PLLC

(57) ABSTRACT

A method to form a stacked CMOS image sensor includes forming a signal processing layer including a plurality of discrete signal processing circuit, an image sensor layer including a plurality of discrete image sensing units, and an intermediate capacitor layer including a dielectric layer and a plurality of capacitors. Each capacitor includes a first electrode, a V-shaped or U-shaped first electrode material layer electrically connecting to the first electrode, a second electrode material layer on the first electrode material layer having the dielectric layer there-between, and a second electrode electrically connecting to the second electrode material layer. The method further includes bonding the signal processing layer to the intermediate capacitor layer with each second electrode electrically connected to a signal processing circuit, and bonding the image sensor layer to the intermediate capacitor layer with each first electrode electrically connected to an image sensing unit.

19 Claims, 8 Drawing Sheets

(52) U.S. Cl.
CPC ...... *H01L 27/0688* (2013.01); *H01L 27/1464* (2013.01); *H01L 27/1469* (2013.01); *H01L 27/14609* (2013.01); *H01L 27/14634* (2013.01); *H01L 28/90* (2013.01); *H01L 28/91* (2013.01)

(58) Field of Classification Search
USPC .......................................................... 257/534
See application file for complete search history.

(56) References Cited

U.S. PATENT DOCUMENTS

| | | |
|---|---|---|
| 8,637,800 B2 | 1/2014 | Kozlowski |
| 8,802,538 B1 | 8/2014 | Liu et al. |
| 9,490,282 B2 * | 11/2016 | Yang .................. H01L 27/14629 |
| 9,645,451 B2 * | 5/2017 | Kubota .................. G02F 1/1343 |
| 2006/0118907 A1 | 6/2006 | Park |
| 2011/0260221 A1 * | 10/2011 | Mao .................... H01L 27/1464 |
| | | 257/291 |
| 2012/0267511 A1 | 10/2012 | Kozlowski |
| 2013/0292794 A1 | 11/2013 | Pai |
| 2015/0035028 A1 * | 2/2015 | Fan .................. H01L 27/14623 |
| | | 257/292 |
| 2015/0060968 A1 | 3/2015 | Sa et al. |

OTHER PUBLICATIONS

European Patent Office (EPO) the Extended European Search Report for 16202206.5 dated May 8, 2017 10 Pages.

* cited by examiner

CMOS IMAGE SENSOR AND FABRICATION METHOD THEREOF

CROSS-REFERENCES TO RELATED APPLICATIONS

This application claims the priority of Chinese Patent Application No. CN201510916698.6, filed on Dec. 10, 2015, the entire content of which is incorporated herein by reference.

FIELD OF THE DISCLOSURE

The present disclosure generally relates to the field of image sensing technology and, more particularly, relates to a stacked CMOS image sensor and fabrication methods thereof.

BACKGROUND

With fast development of electrical and electronical technology, more and more modern mobile electronic products that use image sensor technology, such as smart phones, digital cameras, notebook computers, etc., have been rapidly developed and widely used. Currently, people spend significantly increased time on mobile phones and other electronic products and, tend to have more and more demands on product quality and personal experience. Today, most electronic devices are capable for snapping pictures and taking videos, and the total number of pixels in a camera has increased from the original several hundreds of thousands to five millions or even more. In electronic products, a major component for imaging is image sensor. Therefore, requirements on imaging quality of image sensors have become increasingly high.

Image sensor is a device to convert optical signals into electrical signals. Image sensor includes charge coupled device (CCD) and complementary metal-oxide-semiconductor (CMOS) image transistor chip. Compared to traditional CCD sensor, CMOS image sensor demonstrates a number of advantages, such as low energy consumption, low cost, compatibility with CMOS technology, etc. Therefore, CMOS image sensor has become more popular. Specifically, CMOS image sensor has not only been used in the field of consumer electronics such as digital camera, cell phone camera, and camcorder, but also been widely used in the fields of automobile electronics, monitoring, biotechnology, and medical science, etc.

However, CMOS image sensors fabricated by existing methods may need to be further improved. Specifically, the fill factor in existing CMOS image sensors may be relatively small and noise (such as kTC thermal noise) may be generated during the operation of the CMOS image sensors.

The disclosed fabrication method and semiconductor structure are directed to solve one or more problems set forth above and other problems in the art.

BRIEF SUMMARY OF THE DISCLOSURE

One aspect of the present disclosure includes a method for fabricating a stacked CMOS image sensor. The method includes forming a first dielectric layer on a first substrate, forming a plurality of discrete first electrodes on the first dielectric layer, forming a second dielectric layer to cover the first dielectric layer and the plurality of first electrodes, forming a plurality of etched trenches in the second dielectric layer with each etched trench exposing one or more surface portions of a corresponding first electrode, forming a first electrode material layer on sidewall and bottom surfaces of each etched trench to electrically connect to a corresponding first electrode, forming a dielectric material layer to cover the second dielectric layer and the first electrode material layer in each etched trench, forming a second electrode material layer on the dielectric material layer to fill up each etched trench, and forming a plurality of discrete second electrodes with each second electrode electrically connecting to a corresponding second electrode material layer and also covering corresponding portions of the dielectric material layer. The method further includes forming a plurality of discrete signal processing circuits on a second substrate, and bonding the second substrate to the first substrate with each signal processing circuit electrically connected to a corresponding second electrode. Moreover, the method includes removing the first substrate to expose the first dielectric layer. Finally, the method includes forming a plurality of discrete image sensing units on a third substrate, and then bonding the third substrate to the exposed first dielectric layer with each image sensing unit electrically connected to a corresponding first electrode.

Another aspect of the present disclosure provides a stacked CMOS image sensor. The stacked CMOS image sensor includes a signal processing layer; an image sensor layer; and an intermediate capacitor layer between the signal processing layer and the image sensor layer. The signal processing layer includes a plurality of discrete signal processing circuits, the image sensor layer includes a plurality of discrete image sensing units each electrically connected to one first electrode of the intermediate capacitor layer, and the intermediate capacitor layer includes a dielectric layer, and a plurality of capacitors. Further, each capacitor includes a first electrode, a V-shaped or U-shaped first electrode material layer electrically connecting to the first electrode, a second electrode material layer on the first electrode material layer having the dielectric layer there-between, and a second electrode electrically connecting to the second electrode material layer and also to one signal processing circuit of the signal processing layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 16:
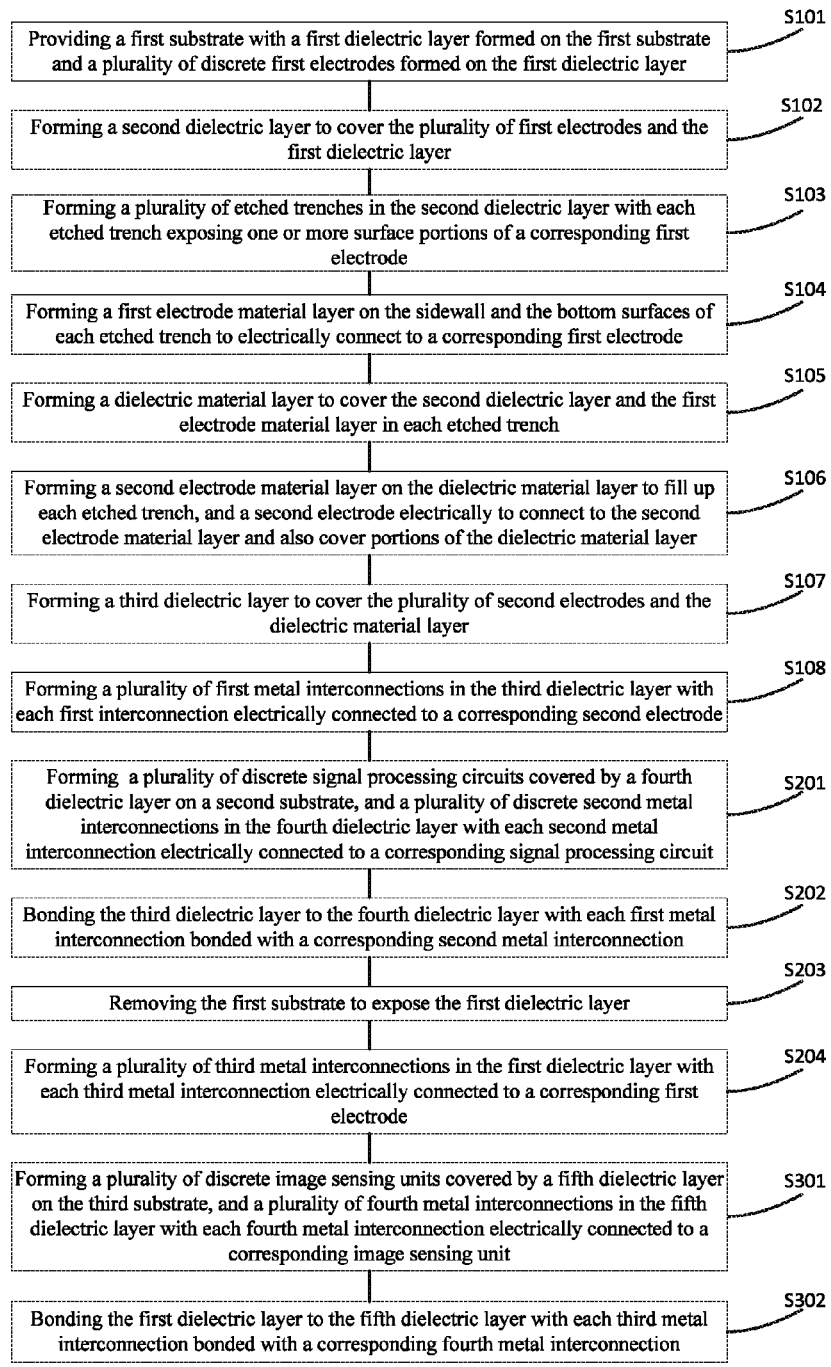
FIG. 16 illustrates a flowchart of an exemplary fabrication process consistent with disclosed embodiments.

FIG. 16 shows a flowchart of an exemplary fabrication process for an exemplary CMOS image sensor consistent with disclosed embodiments. FIGS. 1-14 show schematic views of semiconductor structures corresponding to certain stages of the exemplary fabrication method.

Figure 1:
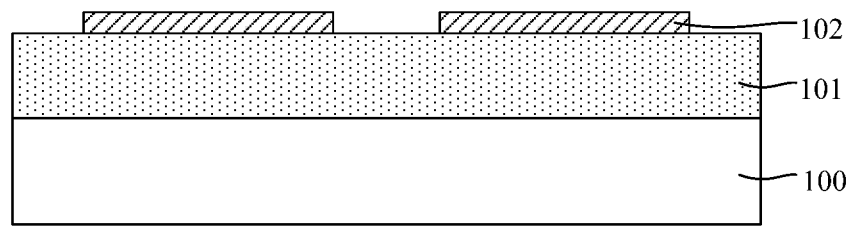
FIGS. 1-14 illustrate schematic views of semiconductor structures corresponding to certain stages of an exemplary fabrication method for a CMOS image sensor consistent with disclosed embodiments.

In FIG. 16, at the beginning of the fabrication process, a first substrate is provided (S101). FIG. 1 shows a schematic view of a corresponding semiconductor substrate.

Referring to FIG. 1, a first substrate 100 is provided. A first dielectric layer 101 may be formed on the first substrate 100. A plurality of discrete first electrodes 102 may be formed on the first dielectric layer 101.

The first substrate 100 may be used as a carrier substrate for subsequent fabrication process. The first substrate 100 may be made of Si, Ge, GeSi, SiC, or any other appropriate material, such as Group III-V compounds including GaAs, etc.

The first dielectric layer 101 may be made of $SiO_x$, $SiN_x$, or any other appropriate dielectric material.

The plurality of first electrodes 102 may be used as connection points to electrically connect subsequently-formed capacitors to other electronic components. Further, during a subsequent process to form a plurality of first sub-electrode material layers, the first electrodes 102 may also be used to electrically connect to the plurality of first sub-electrode material layers and thus form a plurality of parallel capacitors.

The plurality of first electrodes 102 may be made of doped polycrystalline silicon or metal. In one embodiment, the plurality of first electrodes 102 are made of doped polycrystalline silicon.

The plurality of first electrodes 102 may be formed by a process including the following steps. First, an electrode material layer may be formed on the first dielectric layer 101. Then, a plurality of discrete first electrodes 102 may be formed by etching the electrode material layer using an etch mask.

Figure 2:
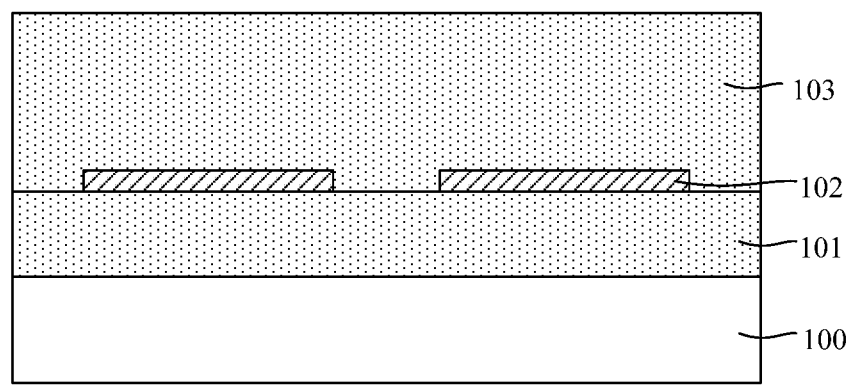

Further, returning to FIG. 16, a second dielectric layer may be formed to cover the plurality of first electrodes and the first dielectric layer (S102). FIG. 2 shows a schematic cross-section view of the corresponding semiconductor structure.

Referring to FIG. 2, a second dielectric layer 103 may be formed on the plurality of first electrodes 102. The second dielectric layer 103 may cover the plurality of first electrodes 102 and the first dielectric layer 101.

In a subsequent process, a plurality of capacitors may be formed in the second dielectric layer 103. The second dielectric layer 103 may be made of $SiO_x$, $SiN_x$, or any other appropriate dielectric material.

Figure 3:
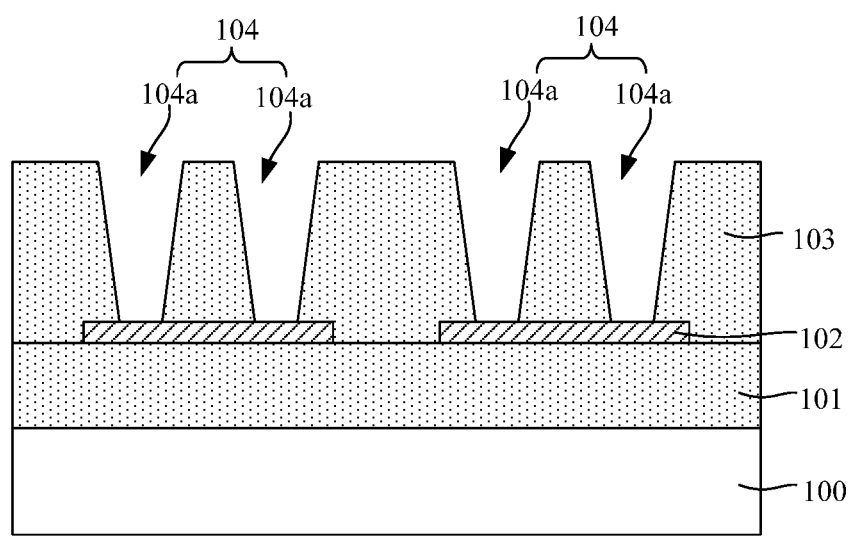

Returning to FIG. 16, further, a plurality of etched trenches may be formed in the second dielectric layer (S103). FIG. 3 shows a schematic cross-section view of the corresponding semiconductor structure.

Referring to FIG. 3, a plurality of etched trenches 104 may be formed in the second dielectric layer 103 by etching the second dielectric layer 103 using an etch mask. Each etched trench 104 may expose one or more portions of the surface of a corresponding first electrode 102.

The plurality of etched trenches 104 may be used to form a plurality of capacitors in a subsequent process. Fabricating the plurality of capacitors based on the etched trenches 104 may ensure that the formed capacitors are relatively narrow along a lateral direction, i.e., along a direction parallel to the surface of the first substrate 100. In the meantime, the etched trenches 104 may also be able to improve the capacitance values of the formed capacitors despite the relatively narrow lateral spaces occupied by the capacitors.

Further, each etched trench 104 may include at least one sub-trench.

In one embodiment, when the number of sub-trenches in each etched trench 104 is greater than one, neighboring sub-trenches in each etched trench may be separated from each other and the bottoms of the sub-trenches may expose different portions of the surface of a same first electrode 102. Further, when each etched trench includes multiple sub-trenches, a capacitor may be formed in each sub-trench. In addition, the multiple capacitors formed in the sub-trenches of an etched trench may be electrically connected to a corresponding first electrode 102 and a corresponding second electrode formed subsequently. As such, the capacitance value between the two connection points, i.e. the first electrode 102 and the subsequently-formed second electrode, may be further improved. Moreover, an increase in the capacitance value may be helpful for reducing thermal noise generated during the operation of the CMOS image sensor. For example, an increase in the capacitance value may help to reduce kTC noise, which is known as a fluctuation noise of a resistor in a charging circuit due to temperature fluctuation during charging-and-discharging process.

For illustration purpose, as shown in FIG. 3, the present disclosure is primarily described based on each etched trench 104 having two sub-trenches 104a. In one embodiment, the shapes and the dimensions of the sub-trenches 104a may be the same so that the subsequently-formed capacitors in the sub-trenches may be identical in shape, structure, and electrical properties. Therefore, in addition to the increased total capacitance value, the capacitors formed in the sub-trenches 104a may have highly consistent charging-and-discharging properties, which may further improve the performance of the CMOS image sensor.

The afore-mentioned shape of the sub-trenches 104a may refer to the cross-section shape of each sub-trench 104a along a direction perpendicular to the surface of the first substrate 100 and the cross-section shape of each sub-trench 104a along a direction parallel to the surface of the first substrate 100. Specifically, the cross section of each sub-trench 104a along a direction perpendicular to the surface of the first substrate 100 may have a V-shape or a U-shape; while the cross section of each sub-trench 104a along a direction parallel to the surface of the first substrate 100 may have a circular shape, a polygonal shape, or any other appropriate shape. The dimensions of the sub-trenches 104a may refer to the depth and/or the width of the sub-trenches 104a.

In one embodiment, each sub-trench 104a has a V-shaped cross section along a direction perpendicular to the surface of the first substrate 100. The extension line of the sidewall of each sub-trench 104a and the surface of the first substrate 100 may form an angle in a range of 60° to 90°. Therefore, the upper opening width of each sub-trench 104a may be relatively large and the opening width may gradually decrease as moving towards the bottom of the sub-trench 104a. Therefore, in a subsequent process to form the first electrode material layer, the deposition material may not accumulate at the upper opening of each sub-trench 104a; instead, the deposition material may also be uniformly formed on the sidewall surface of the sub-trench 104a towards the bottom of the sub-trench 104a. As a result, a first electrode material layer with a uniform thickness may be formed on the bottom and the sidewall surfaces of each sub-trench 104a. Further, the V-shaped sub-trenches 104a may also ensure a uniformly distributed dielectric material layer to be formed in a subsequent deposition process.

The cross section of each sub-trench 104a along a direction parallel to the surface of the first substrate 100 may have a circular shape, thus the sidewall surfaces of the sub-trenches 104a may not have sharp turning corners. Therefore, the circular shape may be helpful for improving thickness uniformity of the first electrode material layer formed on the sidewall surfaces of the sub-trenches 104a. Further, after filling a second electrode material layer on the surface of the dielectric material layer formed in the sub-trenches 104a, the distance between the V-shaped first electrode material layer and the second electrode material layer may be uniform and the dielectric constant of the dielectric material layer may also be uniform. Therefore, the precision of the capacitance value of the formed capacitors may be improved.

In one embodiment, the V-shaped sub-trenches 104a may be formed by a plasma etching process. The plasma etching process may use an etching gas including $CF_4$, $CHF_3$, and Ar. Specifically, the flow rate of $CF_4$ may be in a range of 10 sccm to 200 sccm, the flow rate of $CHF_3$ may be in a range of 10 sccm to 200 sccm, while the flow rate of Ar may be in a range of 50 sccm to 200 sccm. The process parameters used in the plasma etching process may also include a source power in a range of 1100 W to 1250 W, an offset power in a range of 200 W to 220 W, an etching chamber pressure in a range of 10 mTorr to 20 mTorr, and an etching chamber temperature in a range of 20° C. to 100° C. Using the above process parameters, the surface morphology of the formed V-shaped sub-trenches 104a may be desired and the angle formed by the extension of the sidewall of the sub-trenches 104a and the surface of the first substrate 100 may be precise.

In other embodiments, the cross section of each sub-trench 104a along the direction perpendicular to the surface of the first substrate 100 may have a U shape, a rectangular shape, or any other appropriate shape.

In other embodiments, the cross section of each sub-trench 104a along the direction parallel to the surface of the first substrate 100 may have a polygon shape or any other appropriate shape.

Figure 4:
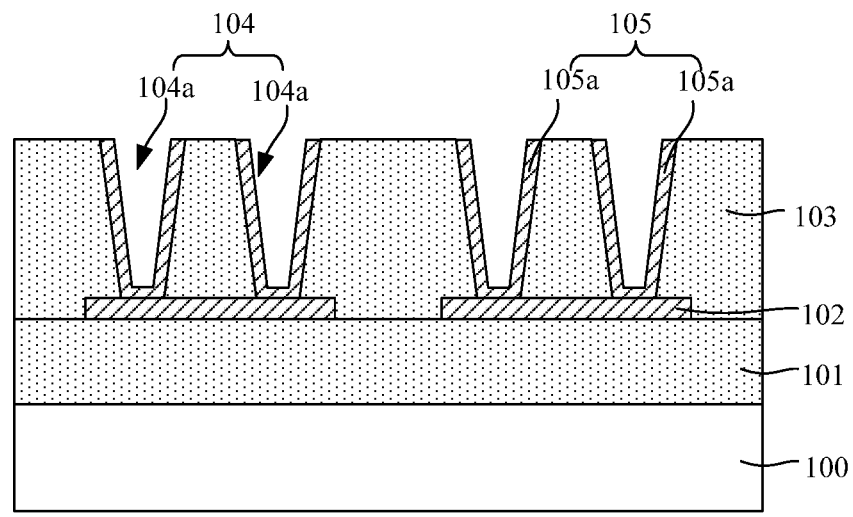

Further, returning to FIG. 16, a first electrode material layer may be formed on the sidewall and the bottom surfaces of each etched trench (S104). FIG. 4 shows a schematic cross-section view of the corresponding semiconductor structure.

Referring to FIG. 4, a plurality of first electrode material layers 105 may be formed on the sidewall and the bottom surfaces of the etched trenches 104. Specifically, the sidewall surface and the bottom surface of each sub-trench 104a may be covered by a corresponding first electrode material layer 105. Each first electrode material layer 105 may be used as an electrode of a subsequently-formed capacitor.

In one embodiment, the plurality of first electrode material layers 105 are made of doped polycrystalline silicon. Using a deposition process to form doped polycrystalline silicon on the sidewall and the bottom surfaces of the sub-trenches 104a may ensure a desired uniformity for the formed first electrode material layer 105. In addition, the stress between the first electrode material layers 105 and the second dielectric layers 103 may be small, thus the properties of subsequently-formed capacitors may be improved. The doping ions in the doped polycrystalline silicon may be phosphor ions, arsenic ions, or boron ions.

The concentration of the doping ions in the first electrode material layers 105 (the doped polycrystalline silicon) may not be too small; otherwise, the subsequently-formed capacitors may have relatively large parasitic resistance, thus the time required to charge or discharge the capacitors may be long, and the signal transfer in the CMOS image sensor may be significantly affected.

In addition, the thickness of the first electrode material layers 105 may not be too small or too large. Specifically, when the first electrode material layers 105 is too thin, parasitic resistance may become very large; however, when the first electrode material layers 105 is too thick, the capacitance value of the subsequently-formed capacitors may be affected.

In one embodiment, the concentration of the doping ions in the first electrode material layer 105 may be in a range of 1E17 atom/$cm^3$ to 1E21 atom/$cm^3$ and the thickness of the first electrode material layer 105 may be in a range of 200 Å to 1000 Å.

The first electrode material layer 105 may be formed by a process including the following steps. First, a first electrode material layer may be formed by a chemical vapor deposition (CVD) process to cover the second dielectric layer 103 and the sidewall and the bottom surfaces of the etched trenches 104. Then, a chemical mechanical polishing (CMP) process or an etch-back process may be performed to remove the portion of the first electrode material layer formed on the surface of the second dielectric layer 103. As such, the remaining portion of the first electrode material layer formed inside of the etched trenches 104 may then form the plurality of first electrode material layers 105.

Moreover, a sacrificial layer may be formed on the surface of the first electrode material layer in each etched trench 104 to fill up the etched trench 104 prior to performing the CMP process or the etch-back process in order to ensure that the first electrode material layer formed in each etched trench 104 will not be affected by the CMP process or the etch-back process. After performing the CMP process or the etch-back process, the sacrificial layer may be removed so that the surface of the portion of the first electrode material layer formed in each etched trench 104 is exposed. In one embodiment, the sacrificial layer may be made of photoresist or any other appropriate sacrificial material.

In one embodiment, the CVD process to form the first electrode material layer may use a silicon-containing gas such as $SiH_4$ and $SiH_2Cl_2$. The process parameters used in the CVD process may include a flow rate of the silicon-containing gas in a range of 10 sccm to 300 sccm, a reaction temperature in a range of 500° C. to 800° C., and a reaction pressure in a range of 10 mTorr to 100 mTorr. The CVD process may also use $H_2$ as a carrier gas and the flow rate of $H_2$ may be in a range of 0.1 slm to 40 slm. Using the process parameters described above may improve the uniformity of the formed first electrode material layers 105.

The doping ions in the first electrode material layers 105 may be formed by an in-situ method during the deposition process or by an ion implantation process performed after the completion of the deposition process.

When the number of sub-trenches in each etched trench is more than one, a first sub-electrode material layer may be formed in each sub-trench 104a of the etched trench 104. The first sub-electrode material layers formed in neighboring sub-trenches may be separated from each other. The multiple first sub-electrode material layers formed in sub-trenches of an etched trench 104 may together form a first electrode material layer. Moreover, the bottoms of the multiple first sub-electrode material layers of the etched trench 104 may all electrically connect to a corresponding first electrode 102.

In one embodiment, each trench 104 includes two sub-trenches. A first sub-electrode material layer 105a may be formed in each sub-trench. Two first sub-electrode material layers 105a together form a first electrode material layer 105.

Figure 5:
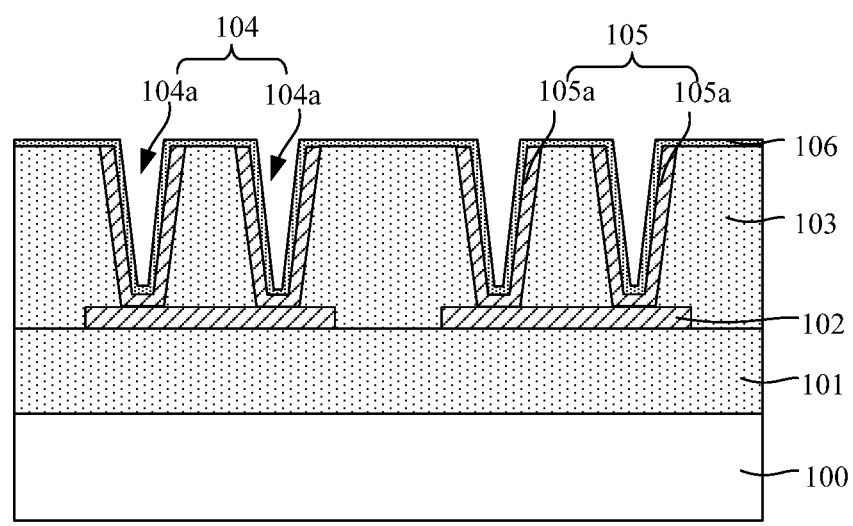

Further, returning to FIG. 16, a dielectric material layer may be formed on the surface of the first electrode material layers and the surface of the second dielectric layer (S105). FIG. 5 shows a schematic cross-section view of the corresponding semiconductor structure.

Referring to FIG. 5, a dielectric material layer 106 is formed on the surfaces of the plurality of first electrode material layers 105 and the second dielectric layer 103. The portion of the dielectric material layer 106 formed in the etched trenches may be used to define the capacitance values for the subsequently-formed capacitors; while the portion of the dielectric material layer 106 formed on the surface of the second dielectric layer 103 may be used as an isolation layer to separate subsequently-formed second electrodes from first electrode material layers 105.

The dielectric material layer 106 may be made of one or more of $SiO_x$, $SiN_x$, SiON, and high-k dielectric material. In one embodiment, the high-k dielectric material may include $HfO_2$, $TiO_2$, HfZrO, HfSiNO, $Ta_2O_5$, $ZrO_2$, $ZrSiO_2$, $Al_2O_3$, $SrTiO_3$, BaSrTiO, etc.

The dielectric material layer 106 may be formed by atomic layer deposition (ALD), plasma enhanced chemical vapor deposition (PECVD), secondary pressure chemical vapor deposition, or sputtering. The dielectric material layer 106 may also be formed by any other appropriate process.

In one embodiment, the dielectric material layer 106 may be formed by ALD. The thickness of the dielectric material layer 106 may be in a range of 10 Å to 500 Å.

Figure 6:
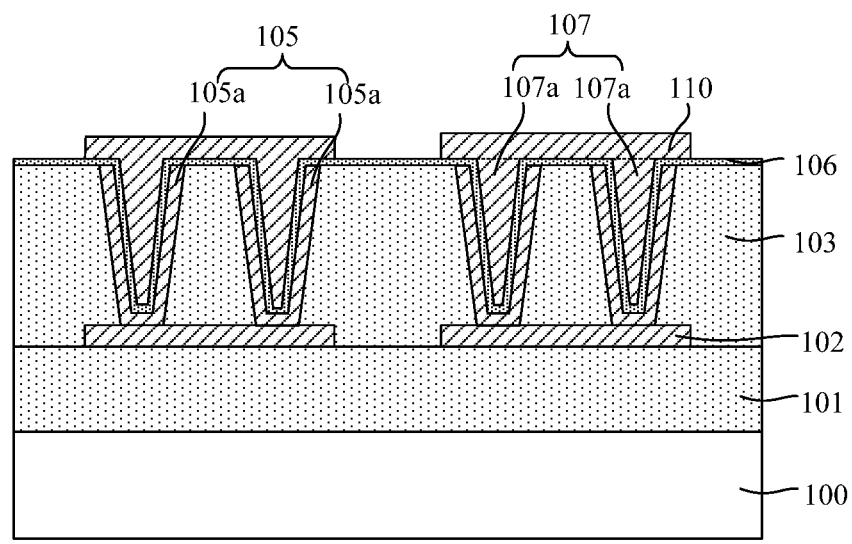

Further, returning to FIG. 16, a plurality of discrete second electrode material layers and a plurality of discrete second electrodes may be formed on the surface of the dielectric material layer (S106). FIG. 6 shows a schematic cross-section view of the corresponding semiconductor structure.

Referring to FIG. 6, a second electrode material layer 107 may be formed on the surface of the portion of the dielectric material layer 106 formed in each etched trench 104 (referring to FIG. 5). Each second electrode material layer 107 may fill up the remaining portion of the corresponding etched trench 104. Further, a second electrode 110 may be formed on the dielectric material layer 106 corresponding to each etched trench 104. The second electrode 110 may be electrically connected to the corresponding second electrode material layer 107. Moreover, neighboring second electrodes 110 may be separated from each other.

The plurality of second electrode material layers 107 and the plurality of second electrodes 110 may be made of doped polycrystalline silicon. The doping type of the second electrode material layers 107 as well as the doping type of the second electrodes 110 may be the same as the doping type of the first electrode material layers 102. For clarity, dashed lines in FIG. 6 are used to schematically separate each second electrode 110 from the corresponding second electrode material layer 107.

Each second electrode material layer 107 may be used as an electrode for a subsequently-formed capacitor, while a corresponding first electrode material layer 105 may be used as another electrode for the subsequently-formed capacitor. The plurality of second electrodes 110 may be used as connection points to further connect the plurality of formed capacitors to other electronic components. In addition, the second electrode 110 may electrically connect the multiple discrete second sub-electrode material layers formed in the sub-trenches 104a (referring to FIG. 5) of a corresponding etched trench 104. Therefore, a plurality of parallel capacitors may be formed between each second electrode 110 and a corresponding first electrode 102. As such, the capacitance value of the capacitor formed between a second electrode 110 and a corresponding first electrode 102 may be increased, thus kTC noise generated during the operation of the CMOS image sensor may be reduced.

In a subsequent process, each first electrode 102 may be electrically connected to an output terminal of a corresponding image sensing unit formed on a third substrate while each second electrode 110 may be electrically connected to a terminal of a signal processing circuit formed on a second substrate. The capacitor formed between a first electrode 102 and a second electrode 110 may be used to store induced charges coming out from the image sensing unit so that sharp images may be obtained when capturing images of moving objects. The CMOS image sensor formed in the present disclosure may be used in global shutter camera, camcorder, or other imaging equipment. When camera, camcorder, or other imaging equipment adopting the CMOS image sensor formed by the disclosed method is used to capture images of moving objects, the obtained images may not be deformed.

In one embodiment, the plurality of second electrodes 110 and the plurality of second electrode material layers 107 may be formed simultaneously. The process to simultaneously form the second electrodes 110 and the second electrode material layers 107 may include the following steps. First, a doped polycrystalline silicon layer may be formed to cover the dielectric material layer 106. The doped polycrystalline silicon layer may also fill up the plurality of etched trenches. Further, a planarization process (such as CMP process) may be performed to planarize the surface of the doped polycrystalline silicon layer. A mask layer may then be formed on the doped polycrystalline silicon layer after the planarization process. The mask layer may cover a portion of the polycrystalline silicon layer formed on each etched trench 104 (referring to FIG. 5). Further, the portion of the doped polycrystalline silicon layer exposed by the mask layer may be removed by an etching process using the mask layer as an etch mask. A plurality of discrete second electrode material layers 107 may then be formed on the dielectric material layer 106 in the plurality of etched trenches. The plurality of second electrode material layers 107 may fill up the plurality of etched trenches. In addition, after the etching process, a second electrode 110 may be simultaneously formed on the surface of a corresponding second electrode material layer 107.

Further, when the number of the sub-trenches in each etched trench is more than one, a second sub-electrode material layer may be formed on the dielectric material layer in each sub-trench. That is, multiple second sub-electrode material layers may be formed in each etched trench. Further, neighboring second sub-electrode material layers may be separated from each other. The multiple second sub-electrode material layers together may form a second electrode material layer corresponding to the etched trench. Moreover, the multiple second sub-electrode material layers formed in a corresponding etched trench may be electrically connected with each other through a second electrode.

In one embodiment, the number of the sub-trenches in each etched trench is two. A second sub-electrode material layer 107a may be formed on the dielectric material layer 106 in each sub-trench. Corresponding to each etched trench, a second electrode material layer 107 may be formed by two second sub-electrode material layers 107a. Further, the two second sub-electrode material layers 107a may be electrically connected with each other through a second electrode 110.

Figure 7:
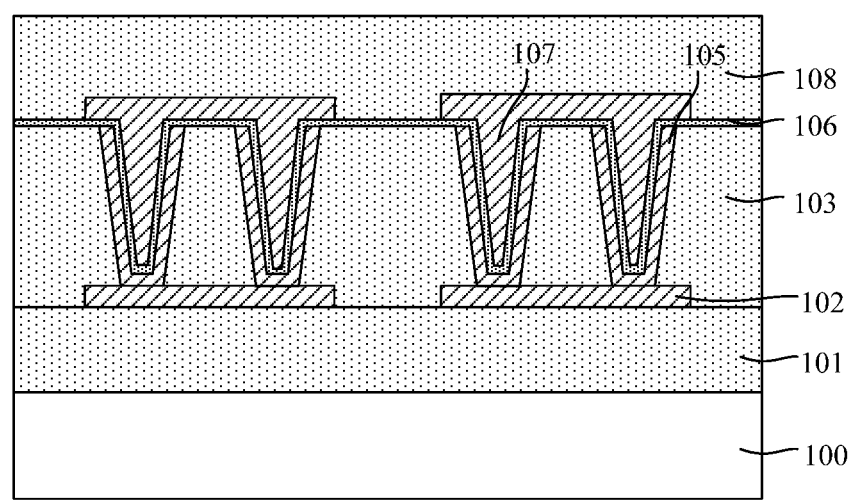

Returning to FIG. 16, further, a third dielectric layer may be formed to cover the plurality of second electrodes and the dielectric material layer (S107). FIG. 7 shows a schematic cross-section view of the corresponding semiconductor structure.

Referring to FIG. 7, a third dielectric layer 108 may be formed on the plurality of second electrodes 110 and the dielectric material layer 106.

The third dielectric layer 108 may be made of $SiO_x$, $SiN_x$, or any other appropriate dielectric material. In addition, the third dielectric layer 108 may have a single-level structure or a multiple-level (≥2 levels) stacked structure.

Figure 8:
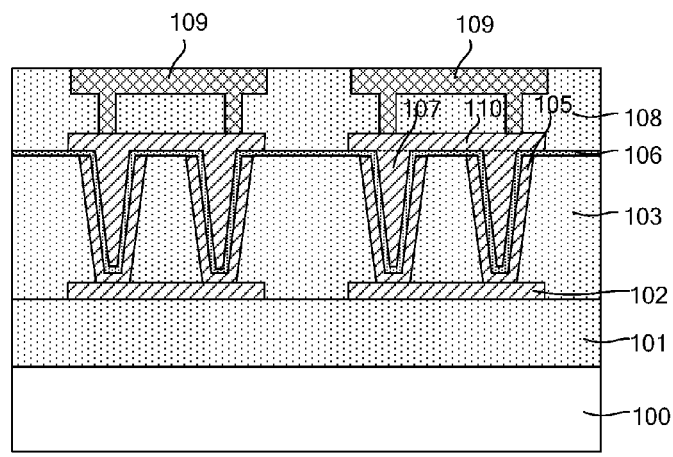

Returning to FIG. 16, further, a plurality of first metal interconnections may be formed in the third dielectric layer with each first metal interconnection electrically connected to a corresponding second electrode (S108). FIG. 8 shows a schematic cross-section view of the corresponding semiconductor structure.

Referring to FIG. 8, a plurality of first metal interconnections 109 may be formed in the third dielectric layer 109. Each first metal interconnection 109 may be electrically connected to a corresponding second electrode 110.

The plurality of first metal interconnections 109 may be used as electrical leads to connect the connection points on the plurality of second electrodes 110. Moreover, the plurality of first metal interconnections 109 may be bonded to a plurality of second metal interconnections formed on a second substrate in a subsequent metal bonding process, thus the bonding strength and the mechanical stability of the image sensor may both be improved.

Further, the first metal interconnections may also be used as a light-shielding layer to prevent incident light from affecting the signal processing circuit on the second substrate. Specifically, the signal processing circuit on the second substrate may include a plurality of transistors and the transistors may include a plurality of doped regions such as source/drain regions formed in the second substrate. When the doped regions are exposed to light, induced charges may be generated, thus the performance of the transistor may be affected. The plurality of first metal interconnections may serve as a light-shielding layer to prevent creating induced charges, thus the performance of the signal processing circuit may be improved.

The plurality of first metal interconnections 109 may be made of Cu, W, Al, or any other appropriate conductive metal or their alloy(s).

In one embodiment, the plurality of first metal interconnections 109 may have a double-Damascus interconnection structure or a single-Damascus interconnection structure. The first metal interconnection 109 may be formed by a process including the following steps. First, a portion of the third dielectric layer 108 may be removed by etching. Specifically, a plurality of trenches may be formed in the third dielectric layer 108 after etching. Each trench may correspond to a second electrode 110 and may be formed above the corresponding second electrode 110. Further, at least two etched vias may be formed in the third dielectric layer 108 by removing a portion of the third dielectric layer 108 on the bottom of each trench. The surface of the corresponding second electrode 110 may be exposed on the bottom of each etched vias. The etched vias and the corresponding trench may be interconnected with each other. Then, the trenches and the etched vias may be filled with metal to form a plurality of first metal interconnections 109. Finally, the surface of the plurality of first metal interconnections 109 may be leveled with the surface of the third dielectric layer 108.

In other embodiments, each first metal interconnection may also be formed by a metal layer and multiple metal plugs with the multiple metal plugs connecting with the metal layer. In one embodiment, the metal layer may have a multiple-level structure and neighboring levels of the metal layer may be electrically connected with each other through metal plugs.

Figure 9:
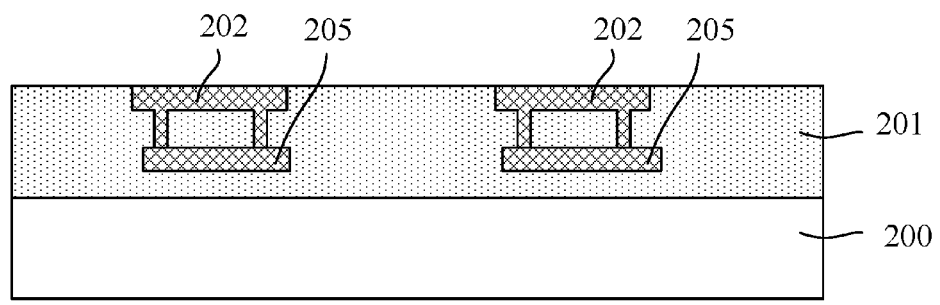

Further, returning to FIG. 16, a second substrate may be provided (S201). FIG. 9 shows a schematic view of the second substrate.

Referring to FIG. 9, a second substrate 200 is provided. A plurality of discrete signal processing circuits 205 may be formed on the second substrate 200. A fourth dielectric layer 201 may be formed to cover the second substrate 200. A plurality of discrete second metal interconnections 202 may be formed in the fourth dielectric layer 201 with each second metal interconnection 202 electrically connected to a corresponding signal processing circuit 205.

The plurality of signal processing circuits may be used to process electrical signals generated by image sensing units formed on a third substrate.

The plurality of signal processing circuits may be formed on the second substrate 200 by an integrated process. In one embodiment, the signal processing circuits may be integrated circuits including a plurality of semiconductor devices and a plurality of interconnections connecting the plurality of semiconductor devices. The semiconductor devices may include active devices (such as transistors, etc.) and/or passive devices (such as resistors, capacitors, etc.). The interconnections may include metal plugs and metal lines electrically connecting with the metal plugs.

In one embodiment, the second substrate 200 may be a semiconductor substrate with a dielectric layer formed on the semiconductor substrate. The semiconductor substrate may be made of Si, GeSi, silicon on insulator (SOI, or any other appropriate semiconductor material. A plurality of active devices may be formed on the semiconductor substrate. The dielectric layer may have a single-level structure or a multiple-level stacked structure. A plurality of interconnections and a plurality of passive devices may be formed in the dielectric layer.

The fourth dielectric layer 201 may cover the second substrate 200. The fourth dielectric layer 201 may be made of $SiO_x$, $SiN_x$, or any other appropriate dielectric material. In one embodiment, the fourth dielectric 201 may be formed on the second substrate 200 through a CVD process.

The surface of the second metal interconnections 202 may be leveled with the surface of the fourth dielectric layer 201. The number of the second metal interconnections 202 may be multiple and each second metal interconnection 202 may be electrically connected with a corresponding signal process circuit. The plurality of second metal interconnections 202 may be used as connection terminals for the signal processing circuits to further connect to the corresponding capacitors formed on the first substrate 100. Further, the plurality of second metal interconnections 202 and the plurality of first metal interconnections 109 (referring to FIG. 8) may be bonded together through a metal bonding process to improve the bonding strength between different layers and the mechanical stability of the formed CMOS image sensor.

In one embodiment, the plurality of second metal interconnections 202 may have a double-Damascus interconnection structure or a single-Damascus interconnection structure. In other embodiments, each second metal interconnections may be an interconnection formed by a metal line and multiple metal plugs with the multiple metal plugs electrically connected with each other through the metal line.

Figure 10:
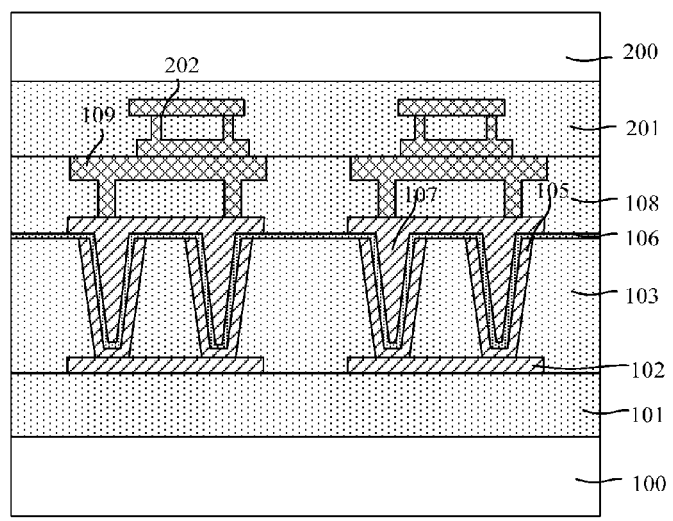

Further, returning to FIG. 16, the third dielectric layer and the fourth dielectric layer may be bonded together (S202). FIG. 10 shows a schematic cross-section view of the corresponding semiconductor structure.

Referring to FIG. 10, the third dielectric layer 108 and the fourth dielectric layer 201 may be bonded together through a fusion bonding process. Specifically, the plurality of first metal interconnections 109 formed in the third dielectric layer 108 may be bonded to the plurality of second metal interconnections 202 formed in the fourth dielectric layer 201 so that each first metal interconnection 109 may be electrically connected to a corresponding second metal interconnection 202.

The third dielectric layer 108 and the fourth dielectric layer 201 may be bonded with each other through a fusion bonding process. The plurality of first metal interconnections and the plurality of second metal interconnections 202 may be bonded together through a metal bonding process. In one embodiment, by adopting such a double-bonding technology, the bonding strength and the mechanical stability of the bonding interface may be improved.

In one embodiment, the fusion bonding process may be performed before performing the metal bonding process. In addition, during the metal bonding process, the bonding temperature may be in a range of 350° C. to 450° C.

Figure 11:
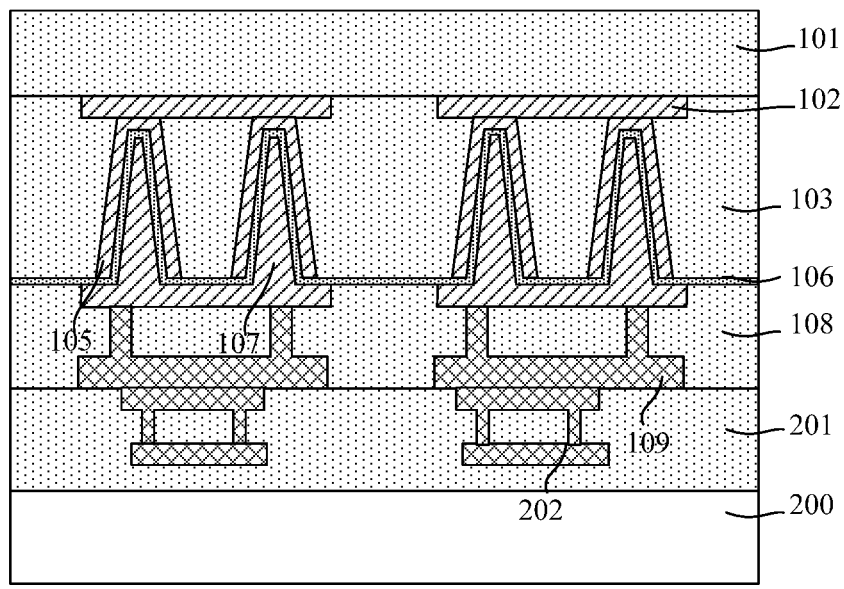

Returning to FIG. 16, after bonding, the first substrate may be removed (S203). FIG. 11 shows a schematic cross-section view of the corresponding semiconductor structure.

Referring to FIG. 11, after bonding the third dielectric layer 108 formed on the first substrate 100 (referring to FIG. 10) to the fourth dielectric layer 201 formed on the second substrate 200, the first substrate 100 may be removed. Moreover, the semiconductor structure shown in FIG. 11 is a structure flipped from the structure shown in FIG. 10 with the first substrate 100 removed.

Figure 12:
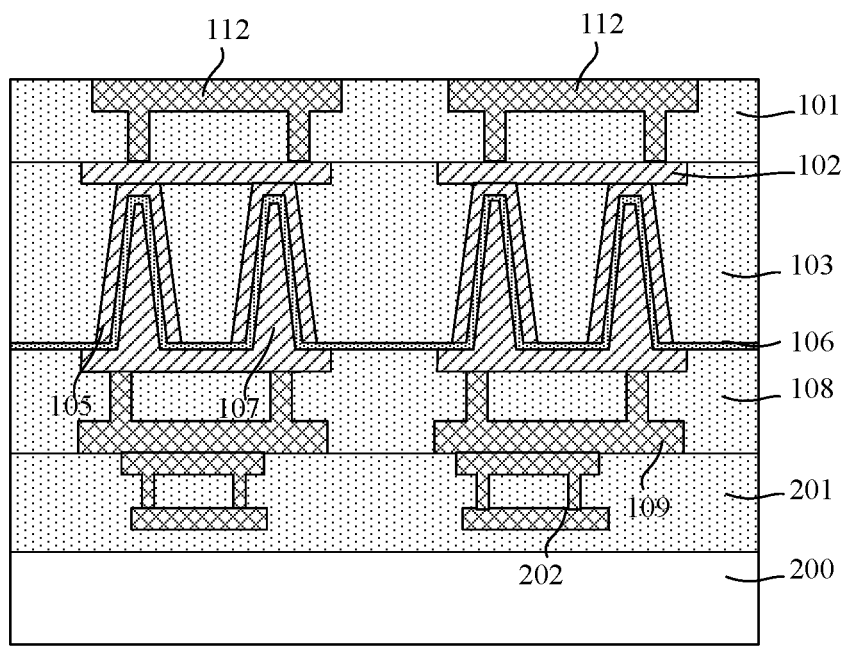

Returning to FIG. 16, a plurality of third metal interconnections may be formed in the first dielectric layer (S204). FIG. 12 shows a schematic cross-section view of the corresponding semiconductor structure.

Referring to FIG. 12, a plurality of third metal interconnections 112 may be formed in the first dielectric layer 101. The plurality of third metal interconnections 112 may be electrically connected to the plurality of first electrodes 102.

The plurality of third metal interconnections 112 may serve as electrical leads to connect the connection points on the plurality of first electrodes 102. In addition, the plurality of third metal interconnections 112 may be bonded to a plurality of fourth metal interconnections formed on a third substrate in a subsequent metal bonding process (that is, the output terminal of each image sensing unit may be electrically connected to an electrode of a corresponding capacitor so that the capacitor can store photo-generated charges from the image sensing unit) in order to improve the bonding strength at the bonding interface. Further, the third metal interconnections 112 may also be used as a light-shielding layer to prevent undesired effects (such as causing induced charges in the doped silicon) due to downward transfer (e.g. along a direction toward capacitors and signal processing circuits) of external light. Such undesired influence may further affect the performance of capacitors and signal processing circuits.

In one embodiment, the plurality of third metal interconnections 112 may have a double-Damascus interconnection structure or a single-Damascus interconnection structure. In other embodiments, each third metal interconnection may be formed by a metal layer and a metal plug with the metal plug electrically connected with the metal layer.

Figure 13:
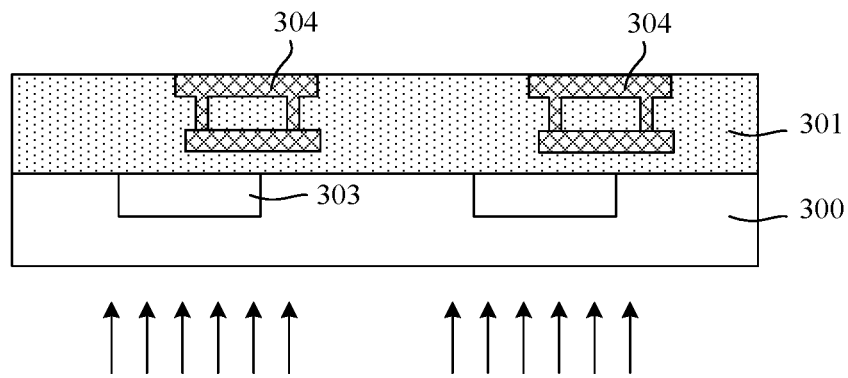

Further, referring to FIG. 16, a third substrate may be provided (S301). FIG. 13 shows a schematic view of the corresponding semiconductor structures.

Referring to FIG. 13, a third substrate 300 may be provided and a plurality of discrete image sensing units 303 may be formed on the third substrate 300.

Each image sensing unit may be a pixel of the image sensor. Each image sensing unit may include a photodiode and a plurality of transistors. The photodiode may be used for sensing external light and creating photo-induced carriers. The plurality of transistors may be used to control the collection and transfer process for photo-induced carriers.

In one embodiment, each image sensing unit may include a photodiode and three or four transistors. When an image sensing unit contains three transistors together with a photodiode, the image sensing unit is a 3T-type, while when an image sensing unit contains four transistors together with a photodiode, the image sensing unit is a 4T-type. For illustration purpose, the present disclosure is described to have a plurality of 4T-type image sensing units. In other embodiments, the image sensing units may be 3-T type or any other appropriate type.

Figure 15:
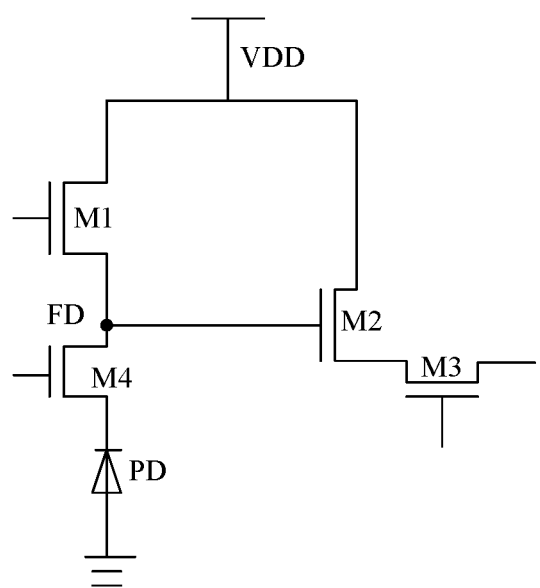
FIG. 15 illustrates a structural diagram of a 4T-type image sensing unit in an exemplary CMOS image sensor consistent with disclosed embodiments.

In one embodiment, as shown in FIG. 15, each 4T-type image sensing unit may include four MOS transistors and one photoelectric diode PD. The four MOS transistors may be a reset transistor M1, an amplifier transistor M2, a selection transistor M3, and a transfer transistor M4.

The operation procedure of the pixel unit in the 4T-type image transistor shown in FIG. 15 may include the following steps. First, prior to receiving light illumination, the reset transistor M1 and the transfer transistor M4 may be turned on while the other transistors may be turned off so that the floated diffusion FD region and the photodiode PD may be reset. Then, all transistors may be turned off and the photodiode PD may receive illumination of light. Further, photo-induced carriers may then be generated through the photoelectrical conversion process. With the transfer transistor M4 turned on while the other transistors all turned off, the photo-induced carriers may then be transferred to the floated diffusion FD region. Further, the amplifier transistor M2 and the selection transistor M3 may be turned on. By sequentially passing through the floated diffusion FD region, the amplifier transistor M2, and the selection transistor M3, photo-induced carriers may be sent out, thus one collection and transfer of optical signal may be completed.

The image sensing units 303 may be formed by an existing semiconductor integrated manufacturing process. One may refer to existing fabrication methods for the details of the manufacturing process.

Moreover, in one embodiment, the formed image sensing units 303 may be back side illumination (BSI) type image sensing units. That is, external light may be irradiated from the back side of the third substrate 300 (referring to FIG. 13). In addition, transistors as well as interconnections connecting the transistors may be formed on the front side of the third substrate 300 to improve the integration degree of the formed image sensing units 303.

Further, referring to FIG. 13, a fifth dielectric layer 301 may also be formed on the third substrate 300. A plurality of discrete fourth metal interconnections 304 may be formed in the fifth dielectric layer 301. The plurality of fourth metal interconnections 304 may be electrically connected to the output terminals of the plurality of image sensing units 303. The surface of the fourth metal interconnections 304 may be leveled with the surface of the fifth dielectric layer 301.

In one embodiment, the plurality of fourth metal interconnections 304 may have a double-Damascus interconnection structure or a single-Damascus interconnection structure. In other embodiments, each fourth metal interconnection may be formed by a metal layer and a metal plug with the metal plug electrically connected with the metal layer.

Further, each fourth metal interconnection 304 may be electrically connected to a corresponding image sensing unit 303. In other embodiments, each fourth metal interconnection may be electrically connected to at least two image sensing units.

Figure 14:
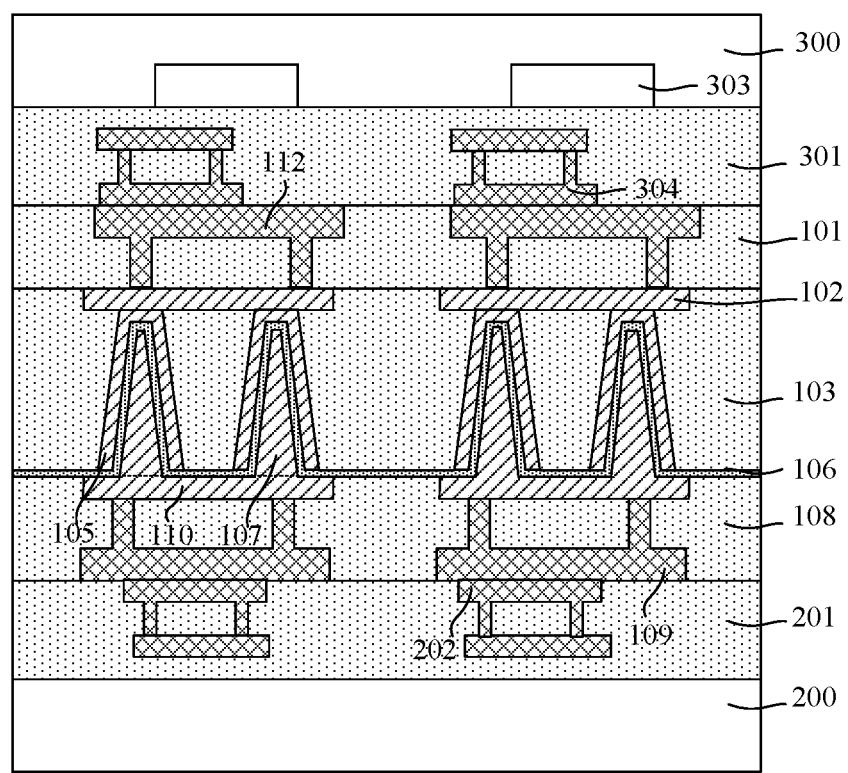

Returning to FIG. 16, further, the first dielectric layer and the fifth dielectric layer may be bonded together (S302). FIG. 14 shows a schematic cross-section view of the corresponding semiconductor structure.

Referring to FIG. 14, the first dielectric layer 101 may be bonded to the fifth dielectric layer 301. Moreover, the plurality of third metal interconnections 112 in the first dielectric layer 101 may be bonded to the plurality of fourth metal interconnections 304 in the first dielectric layer so that each third metal interconnection 112 may be electrically connected to a corresponding fourth metal interconnection 304.

The first dielectric layer 101 and the fifth dielectric layer 301 may be bonded together through a fusion bonding process. The third metal interconnections 112 and the fourth metal interconnections 304 may be bonded with each other through a metal bonding process. In one embodiment, by adopting such a double-bonding technology, the bonding strength and the mechanical stability at the bonding interface may be improved.

In one embodiment, the fusion bonding process may be performed before performing the metal bonding process. In addition, during the metal bonding process, the bonding temperature may be in a range of 350° C. to 450° C.

According to the disclosed fabrication method for the CMOS image sensor, a bottom signal processing layer (including signal processing circuits), an intermediate capacitor layer (including capacitors), and an image sensor layer (including image sensing units) may be formed separately through independent fabrication processes. The bottom signal processing layer, the intermediate capacitor layer, and the image sensor layer may then be bonded together to form a stacked structure with electrical connections between the image sensor layer and the intermediate capacitor layer and also between the intermediate capacitor layer and the signal processing layer. During the disclosed fabrication process, the signal processing circuits and the capacitors may be formed on substrates different from the substrate on which image sensing units are formed. Therefore, while a relatively high integration degree of CMOS image sensors is still ensured, the photosensitive areas of the image sensing units formed on the third substrate may be made larger so that the fill factor of the CMOS image sensor may be improved.

In addition, the first electrode material layers for the capacitors in the intermediate capacitor layer may be formed on the sidewall and the bottom surfaces of the etched trenches so that the first electrode material layers may have a reversed V-shape or a reversed U-shape. Therefore, the area of the first electrode material layer may be increased and the capacitance value of the formed capacitors may also be improved. As a result, thermal noise (kTC noise) generated during the operation of the CMOS image sensor may be reduced.

Further, besides being used as electrical connection structures, the first metal interconnections, the second metal interconnections, the third metal interconnections, and the fourth metal interconnections may also be used to prevent undesired effects (e.g., causing induced charges in the doped silicon) due to downward transfer of external light (i.e., light transfer along a direction toward capacitors and signal processing circuits). Such undesired influence may further affect the performance of capacitors and signal processing circuits. Moreover, by adopting a double-bonding technology, the bonding strength and the mechanical stability at the bonding interface may be improved.

The present disclosure also provides a CMOS image sensor. FIG. 14 shows a schematic cross-section view of an exemplary CMOS image sensor consistent with disclosed embodiments.

Referring to FIG. 14, the disclosed CMOS image sensor may include a bottom signal processing layer. The bottom signal processing layer may further include a second substrate 200, a plurality of discrete signal processing circuits (not shown) formed on the second substrate 200, a fourth dielectric layer 201 formed on the second substrate 200, and a plurality of discrete second metal interconnections 202 formed in the fourth dielectric layer 201. Each second metal interconnection may be electrically connected to a corresponding signal processing circuit.

The CMOS image sensor may also include an intermediate capacitor layer. The intermediate capacitor layer may include a dielectric layer and a plurality of capacitors formed in the dielectric layer. Each capacitor may further include a first electrode 102, a reversed V-shaped or U-shaped first electrode material layer 105 electrically connecting to the first electrode 102, a second electrode material layer 107 corresponding to the first electrode material layer 105, a second electrode 110 electrically connecting to the second electrode material layer 107, and a dielectric material layer 106 formed between the first electrode material layer 105 and the second electrode material layer 107. The intermediate capacitor layer may also include a third metal interconnection 112 formed in the dielectric layer and electrically connected with the first electrode 102. The third metal interconnection 112 may be formed above the first electrode 102. Further, the intermediate capacitor layer may include a plurality of first metal interconnections 109 electrically connected with the plurality of second electrodes 110. Each first metal interconnection 109 may be situated below the corresponding second electrode 110. Further, each first metal interconnection 109 may be bonded to a corresponding second metal interconnection 202 in the bottom signal processing layer.

The CMOS image sensor may further include an image sensor layer formed above the intermediate capacitor layer. The image sensor layer may include a third substrate 300, a plurality of discrete image sensing units 303 formed on the front side of the third substrate 300, a fifth dielectric layer 301 formed on the front side of the third substrate 300, and a plurality of discrete fourth metal interconnections 304 formed in the fifth dielectric layer 301. One terminal of each fourth metal interconnection 304 may be electrically connected to an output terminal of a corresponding image sensing unit 303 while the other terminal of the fourth metal interconnection 304 may be bonded to a corresponding third metal interconnection 112 in the intermediate capacitor layer.

Further, the dielectric layer may include a third dielectric layer 108, a second dielectric layer 103 formed above the third dielectric layer 108, and a first dielectric layer 101 formed above the second dielectric layer 103. Moreover, the first metal interconnections 109 and the second electrodes 110 may be formed in the third dielectric layer 108; the first electrodes 102, the first electrode material layers 105, a portion of the dielectric material layer 106, and the second electrode material layers 107 may be formed in the second dielectric layer 103; while the third metal interconnections 112 may be formed in the first dielectric layer 101.

Each reversed V-shaped or U-shaped first electrode material layer 105 may include at least one reversed V-shaped or U-shaped first sub-electrode material layer.

In one embodiment, when each reversed V-shaped or U-shaped first electrode material layer 105 includes two or more reversed V-shaped or U-shaped first sub-electrode material layers, the bottoms of the reversed V-shaped or U-shaped first sub-electrode material layers may be connected with each other through a corresponding first electrode. The open ends of neighboring reversed V-shaped or U-shaped first sub-electrode material layers may be separated from each other. Each reversed V-shaped or U-shaped first sub-electrode material layer may correspond to a second sub-electrode material layer in the dielectric layer. Neighboring second sub-electrode material layer may be separated from each other. Each second sub-electrode material layer may be formed inside of the corresponding V-shaped or U-shaped first sub-electrode material layer. The first sub-electrode material layer and the corresponding second sub-electrode material layer may be isolated from each other by a dielectric material layer. A plurality of second sub-electrode material layers may form a second electrode material layer, and the plurality of second sub-electrode material layers may be electrically connected together with each other through a corresponding second electrode.

For illustration purpose, each first electrode material layer is described to have a reversed V-shape and may include 2 reversed V-shaped sub-electrode material layers. In other embodiments, the shape of the first electrode material layer may be U-shape or any other appropriate shape and the number of first sub-electrode material layers in each first electrode material layer may be more than two. In one embodiment, the two reversed V-shaped sub-electrode material layers may be electrically connected with each other through a corresponding first electrode 102. The open ends of the two reversed V-shaped sub-electrode material layers may be separated from each other. Each reversed V-shaped first sub-electrode material layer may correspond to a second sub-electrode material layer in the dielectric layer. The two second sub-electrode material layers may also be separated from each other. Each second sub-electrode material layer may be formed inside of the corresponding V-shaped first sub-electrode material layer. The first sub-electrode material layer and the corresponding second sub-electrode material layer may be isolated from each other by a dielectric material layer 106. The two second sub-electrode material layers may form a second electrode material layer, and the two second sub-electrode material layers may be electrically connected with each other through a corresponding second electrode 110.

The plurality of second metal interconnections 202 and the plurality of first metal interconnections 109 may be bonded together through a metal bonding process. The fourth metal interconnections 304 and the third metal interconnections 112 may be bonded with each other through a metal bonding process. The dielectric layer and the fifth dielectric layer 301 may be bonded together through a fusion bonding process.

The plurality of first electrode material layers may also have any other appropriate concave shape.

The plurality of first electrodes 102 and the plurality of second electrodes 110 may be made of doped polycrystalline silicon or metal. The plurality of first electrode material layers 105 and the plurality of second electrode material layers 110 may be made of doped polycrystalline silicon.

The thickness of the plurality of first electrode material layers 105 may be in a range of 200 Å to 1000 Å. The concentration of the doping ions in the plurality of first electrode material layers 105 may be in a range of $1E17$ atom/cm$^3$ to $1E21$ atom/cm$^3$.

Compared to existing CMOS image sensors and the corresponding fabrication methods, the disclosed CMOS image sensor with a stacked structure and fabrication methods may demonstrate the following advantages.

First, according to the disclosed fabrication method for CMOS image sensor, a bottom signal processing layer (including signal processing circuits), an intermediate capacitor layer (including capacitors), and an image sensor layer (including image sensing units) may be formed separately through independent fabrication processes. The bottom signal processing layer, the intermediate capacitor layer, and the image sensor layer may then be bonded together to form a stacked structure with electrical connections between the image sensor layer and the intermediate capacitor layer and also between the intermediate capacitor layer and the signal processing layer. During the disclosed fabrication process, the signal processing circuits and the capacitors may be formed on substrates different from the substrate on which image sensing units are formed. Therefore, while a relatively high integration degree of CMOS image sensors is still ensured, the photosensitive areas of the image sensing units formed on the third substrate may be made larger so that the fill factor of the CMOS image sensor may be improved.

In addition, the first electrode material layers of the capacitors in the intermediate capacitor layer may be formed on the sidewall and the bottom surfaces of the etched trenches, thus the area of the first electrode material layer may be increased and the capacitance value of the formed capacitors may also be improved. As a result, thermal noise (kTC noise) generated during the operation of the CMOS image sensor may be reduced.

Further, besides being used as electrical connection structures, the first metal interconnections, the second metal interconnections, the third metal interconnections, and the fourth metal interconnections may also be used to prevent undesired effects (e.g., causing induced charges in the doped silicon) due to downward transfer of external light (i.e., light transfer along a direction toward capacitors and signal processing circuits). Such undesired influence may further affect the performance of capacitors and signal processing circuits. Moreover, by adopting a double-bonding technology, the bonding strength and the mechanical stability at the bonding interface may be improved.

Further, when the number of sub-trenches in each etched trench 104 is greater than one, neighboring sub-trenches in each etched trench may be separated from each other and the bottoms of the sub-trenches may expose different portions of the surface of a same first electrode 102. When the number of sub-trenches is multiple, a capacitor may be formed in each sub-trench. In addition, the multiple capacitors formed in the multiple sub-trenches may be electrically connected with a corresponding first electrode 102 and a corresponding second electrode 110. As such, the capacitance value between the connection points, i.e. the first electrode 102 and the second electrode 110, may further increase, which may be helpful for reducing thermal noise, i.e. kTC noise, which is generated during the operation of CMOS image sensor. Specifically, as a fluctuation noise of the resistor in the charging-and-discharging circuit due to temperature fluctuation during charging-and-discharging process, kTC noise may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a CMOS image sensor, comprising:
    forming a first dielectric layer on a first substrate;
    forming a plurality of discrete first electrodes on the first dielectric layer;
    forming a second dielectric layer to cover the first dielectric layer and the plurality of first electrodes;
    forming a plurality of etched trenches in the second dielectric layer with each etched trench exposing one or more surface portions of a corresponding first electrode;
    forming a first electrode material layer on sidewall and bottom surfaces of each etched trench to electrically connect to a corresponding first electrode;
    forming a dielectric material layer to cover the second dielectric layer and the first electrode material layer in each etched trench;
    forming a second electrode material layer on the dielectric material layer to fill up each etched trench;
    forming a plurality of discrete second electrodes with each second electrode electrically connecting to a corresponding second electrode material layer and also covering corresponding portions of the dielectric material layer;
    forming a plurality of discrete signal processing circuits on a second substrate;
    bonding the second substrate with the first substrate, wherein each signal processing circuit is electrically connected to a corresponding second electrode;
    removing the first substrate to expose the first dielectric layer;
    forming a plurality of discrete image sensing units on a third substrate; and
    bonding the third substrate with the exposed first dielectric layer, wherein each image sensing unit is electrically connected to a corresponding first electrode.

2. The method for fabricating the CMOS image sensor according to claim 1, wherein each etched trench includes one or more sub-trenches.

3. The method for fabricating the CMOS image sensor according to claim 2, wherein:
    the number of sub-trenches in each etched trench is more than one;
    neighboring sub-trenches are isolated from each other; and
    each sub-trench of an etched trench exposes a portion of a surface of a same first electrode.

4. The method for fabricating the CMOS image sensor according to claim 3, further including:
    forming a first sub-electrode material layer on surfaces of a bottom and sidewalls of each sub-trench, wherein the dielectric material layer has a portion formed on the first sub-electrode material layer; and
    forming a second sub-electrode material layer on the dielectric material layer and within each sub-trench, wherein:
    one first electrode material layer is formed by more than one first sub-electrode material layers corresponding to a same etched trench; and
    one second electrode material layer is formed by more than one second sub-electrode material layers corresponding to a same etched trench.

5. The method for fabricating the CMOS image sensor according to claim 1, wherein bonding the second substrate with the first substrate further includes:
    forming a fourth dielectric layer to cover the second substrate, wherein a plurality of discrete second metal interconnections are formed in the fourth dielectric layer and each second metal interconnection is electrically connected with a corresponding signal processing circuit; and
    bonding the third dielectric layer with the fourth dielectric layer with each first metal interconnection in the third dielectric layer bonded to a corresponding second metal interconnection in the fourth dielectric layer, wherein each first metal interconnect is electrically connected with the corresponding second metal interconnect.

6. The method for fabricating the CMOS image sensor according to claim 5, after removing the first substrate, further including:
    forming a plurality of third metal interconnections in the first dielectric layer, wherein each third metal interconnection is electrically connected with a corresponding second electrode.

7. The method for fabricating the CMOS image sensor according to claim 6, wherein bonding the third substrate with the exposed first dielectric layer further includes:
    forming a fifth dielectric layer on the third substrate, wherein a plurality of discrete fourth metal interconnections are formed in the fifth dielectric layer and each fourth metal interconnection is electrically connected to a corresponding image sensing unit; and
    bonding the fifth dielectric layer with the exposed first dielectric layer with each third metal interconnection in the first dielectric layer bonded to a corresponding fourth metal interconnection in the fifth dielectric layer, wherein each third metal interconnect is electrically connected with the corresponding fourth metal interconnect.

8. The method for fabricating the CMOS image sensor according to claim 1, wherein:
    bonding the second substrate with the first substrate and bonding the third substrate with the exposed first dielectric layer include one or more of a fusion bonding process and a metal bonding process;
    the fusion bonding process is performed before performing the metal bonding process; and
    the metal bonding process is performed at a temperature in a range of 350° C. to 450° C.

9. The method for fabricating the CMOS image sensor according to claim 1, wherein: the plurality of second electrode material layers and the plurality of first electrode material layers are made of doped polycrystalline silicon.

10. The method for fabricating the CMOS image sensor according to claim 6, wherein:
   a thickness of the plurality of first electrode material layers is in a range of 200 Å to 1000 Å; and
   a doping concentration in the plurality of first electrode material layers is in a range of 1E17 atom/cm$^3$ to 1E21 atom/cm$^3$.

11. The method for fabricating the CMOS image sensor according to claim 1, wherein the dielectric material layer is made of one or more of SiO$_x$, SiN$_x$, SiON, and a high-k dielectric material.

12. The method for fabricating the CMOS image sensor according to claim 1, wherein a thickness of the dielectric material layer is in a range of 10 Å to 500 Å.

13. The method for fabricating the CMOS image sensor according to claim 1, wherein the plurality of discrete second electrodes and the plurality of discrete first electrodes are made of doped polycrystalline silicon or a metal.

14. The method for fabricating the CMOS image sensor according to claim 7, wherein the plurality of first metal interconnections, the plurality of second metal interconnections, the plurality of third metal interconnections, and the plurality of fourth metal interconnections have a dual-Damascus interconnection structure or a single-Damascus interconnection structure.

15. The method for fabricating the CMOS image sensor according to claim 7, wherein each fourth metal interconnection is electrically connected to one image sensing unit.

16. The method for fabricating the CMOS image sensor according to claim 7, wherein each fourth metal interconnection is electrically connected to at least two image sensing units.

17. The method for fabricating the CMOS image sensor according to claim 1, wherein the image sensing units are back side illumination (BSI) type.

18. A CMOS image sensor, comprising:
   a signal processing layer; an image sensor layer; and an intermediate capacitor layer between the signal processing layer and the image sensor layer, wherein:
      the signal processing layer includes a plurality of discrete signal processing circuits,
      the intermediate capacitor layer includes a dielectric layer, and a plurality of capacitors, wherein: each capacitor includes a first electrode, a V-shaped or U-shaped first electrode material layer electrically connecting to the first electrode, a second electrode material layer on the first electrode material layer having the dielectric layer there-between, and a second electrode electrically connecting to the second electrode material layer and also to one signal processing circuit of the signal processing layer; and
      the image sensor layer includes a plurality of discrete image sensing units each electrically connected to one first electrode of the intermediate capacitor layer;
   a plurality of first metal interconnections formed in the intermediate capacitor layer with each first metal interconnection electrically connected to a corresponding second electrode;
   a plurality of second metal interconnections formed in the signal processing layer with each second metal interconnection electrically connected to a corresponding signal processing circuit;
   a plurality of third metal interconnections formed in the intermediate capacitor layer with each third metal interconnection electrically connected to a corresponding first electrode; and
   a plurality of fourth metal interconnections formed in the image sensor layer with each fourth metal interconnection electrically connected to a corresponding image sensing unit, wherein:
      each first metal interconnection is bonded with a corresponding second metal interconnection to realize electrical connection between the corresponding signal processing circuit in the signal processing layer and the corresponding first electrode in the intermediate capacitor layer; and
      each third metal interconnection is bonded with a corresponding fourth metal interconnection to realize electrical connection between the corresponding second electrode in the intermediate capacitor layer and the corresponding image sensing unit in the image sensor layer.

19. The CMOS image sensor according to claim 18, wherein:
   each V-shaped or U shaped first electrode material layer includes one or more V-shaped or U-shaped first sub-electrode material layers; and
   each second electrode material layer, corresponding to a first electrode material layer, also includes one or more second sub-electrode material layers with each second sub-electrode material layer corresponding to a first sub-electrode material layer.

* * * * *